(12) United States Patent
Sugiura et al.

(10) Patent No.: US 10,262,822 B2
(45) Date of Patent: Apr. 16, 2019

(54) LOAD DRIVE APPARATUS

(71) Applicants:Anden Co., Ltd., Anjo, Aichi-pref. (JP); TOYOTA JIDOSHA KABUSHIKI KAISHA, Toyota-shi, Aichi-ken (JP)

(72) Inventors: Akira Sugiura, Anjo (JP); Nobutomo Takagi, Anjo (JP); Fukuo Ishikawa, Anjo (JP); Shinji Oshita, Toyota (JP); Kenichi Takayoshi, Nisshin (JP)

(73) Assignees: ANDEN CO., LTD., Anjo, Aichi-pref. (JP); TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 50 days.

(21) Appl. No.: 15/399,786

(22) Filed: Jan. 6, 2017

(65) Prior Publication Data

US 2017/0207050 A1 Jul. 20, 2017

(30) Foreign Application Priority Data

Jan. 14, 2016 (JP) ................................. 2016-005286

(51) Int. Cl.
*B60Q 1/04* (2006.01)
*B60Q 11/00* (2006.01)
(Continued)

(52) U.S. Cl.
CPC ......... *H01H 47/002* (2013.01); *B60Q 1/0094* (2013.01); *B60R 16/03* (2013.01);
(Continued)

(58) Field of Classification Search
CPC ...... B60Q 1/0094; B60Q 1/04; B60Q 11/005; B60R 16/03; H01H 47/002
See application file for complete search history.

(56) References Cited

U.S. PATENT DOCUMENTS 9,517,715 B1\* 12/2016 Sitarski ................ B60Q 1/0076
2002/0195980 A1\* 12/2002 Furui .................. F02D 35/0007
318/400.17

(Continued)

FOREIGN PATENT DOCUMENTS

JP 2009-035105 A 2/2009
JP 2010018170 A 1/2010
(Continued)

*Primary Examiner* — Levi Gannon
(74) *Attorney, Agent, or Firm* — Harness, Dickey & Pierce, P.L.C.

(57) ABSTRACT

A load drive apparatus includes: a first drive element that drives a first load; a second drive element that drives a second load; a control circuit that controls the first drive element and the second drive element; a power supply circuit that supplies electric power; and a failsafe circuit that includes an abnormality detection portion detecting whether an abnormality occurs in at least one of the control circuit and the power supply circuit, the failsafe circuit controlling the first drive element and the second drive element to drive the first load and the second load when the abnormality detection portion has detected that an abnormality occurs in at least one of the control circuit and the power supply circuit and also when the load drive apparatus receives at least one of a command directing a drive of the first load and a command directing a drive of the second load.

10 Claims, 2 Drawing Sheets

(51) Int. Cl.
    *B60R 16/03*     (2006.01)
    *H01H 47/00*     (2006.01)
    *B60Q 1/00*     (2006.01)
    *H03K 17/687*     (2006.01)
    *H03K 17/082*     (2006.01)
    *H03K 17/08*     (2006.01)

(52) U.S. Cl.
    CPC ..... *H03K 17/0822* (2013.01); *H03K 17/6871* (2013.01); *B60Q 11/00* (2013.01); *H03K 2017/0806* (2013.01)

(56) References Cited

U.S. PATENT DOCUMENTS

| | | | |
|---|---|---|---|
| 2006/0077613 A1* | 4/2006 | Hornung | H01H 47/004 361/118 |
| 2009/0001888 A1* | 1/2009 | Asada | B60Q 1/1415 315/83 |
| 2009/0072764 A1 | 3/2009 | Kitagawa et al. | |
| 2012/0086337 A1 | 4/2012 | Ohkura et al. | |
| 2013/0076125 A1 | 3/2013 | Aragai | |

FOREIGN PATENT DOCUMENTS

| | | |
|---|---|---|
| JP | 2011-098594 A | 5/2011 |
| JP | 2011-213289 A | 10/2011 |
| JP | 2013071632 A | 4/2013 |
| WO | WO-2011030382 A1 | 3/2011 |

\* cited by examiner

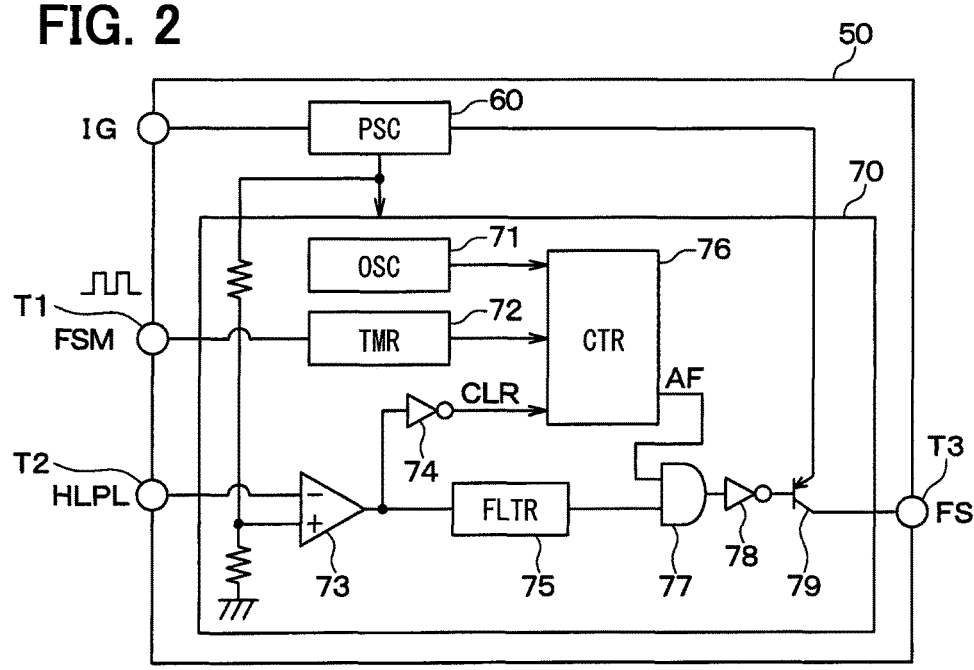
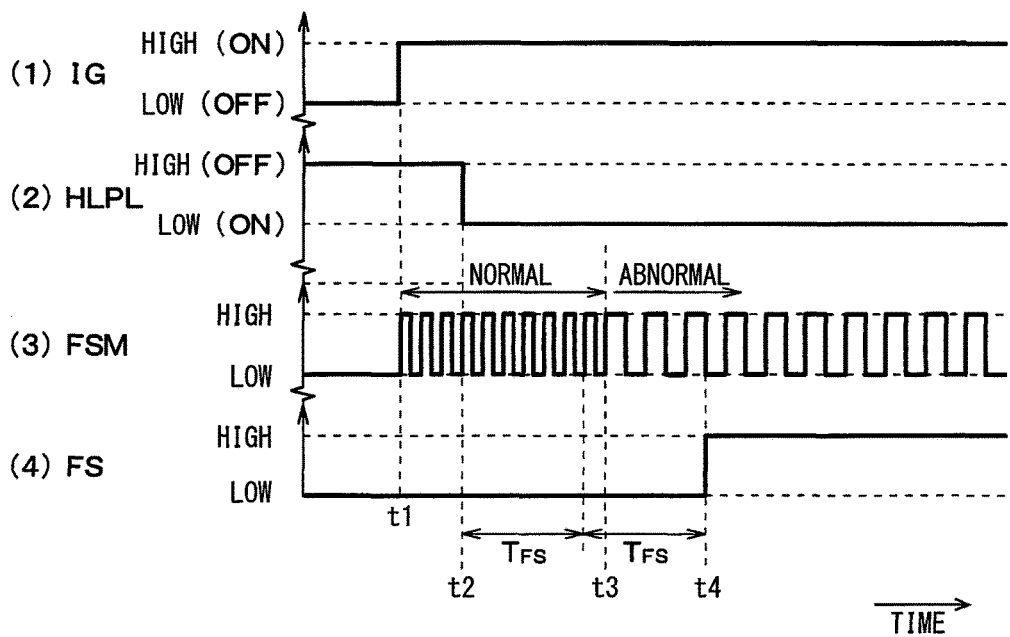

LOAD DRIVE APPARATUS

CROSS REFERENCE TO RELATED APPLICATIONS

This application is based on Japanese Patent Application No. 2016-005286 filed on Jan. 14, 2016, the disclosure of which is incorporated herein by reference.

TECHNICAL FIELD

The present disclosure relates to a load drive apparatus.

BACKGROUND

Patent literature 1: JP 2011-98594 A

Patent literature 1 discloses a load drive apparatus including a basic drive circuit and a backup circuit. The basic drive circuit includes a first MOSFET driving a headlight at a driver seat side and a second MOSFET driving a headlight at a passenger seat side. The backup circuit functions as a failsafe circuit. In the load drive apparatus of Patent literature 1, the backup circuit drives a third MOSFET when there is abnormality in a control circuit and both headlights cannot turn on, so that the headlight at the driver seat side is turned on.

The inventors of the present disclosure have found the following. As described above, the load drive apparatus described in Patent literature 1 includes the third MOSFET for turning on the headlight at the driver seat side in a case when the both of the headlights cannot be turned on. This configuration preliminarily includes a load drive circuit that corresponding to large current to increase cost.

In particular, in recent, a request of a lighting-system load integrated control circuit may be increased, and the lighting-system load integrated control circuit integrally controls a lighting system load such as a headlight and a tail lamp. When a configuration such as the load drive apparatus described in Patent literature 1 is applied to the lighting-system load integrated control circuit, many load drive circuits corresponding to large current such as a third MOSFET may be provided as backup or preliminarily, causing increase of cost further.

SUMMARY

It is an object of the present disclosure to provide a technique enabling to drive a load in a case where an abnormality occurs in a control circuit, without including a load drive element as a backup.

According to one aspect of the present disclosure, a load drive apparatus including: a first drive element that drives a first load; a second drive element that drives a second load, the second drive element and the first drive element being independently placed; a control circuit that controls the first drive element and the second drive element in accordance with input of a command directing drive of at least one of the first load and the second load; a power supply circuit that supplies electric power to the control circuit; and a failsafe circuit that includes an abnormality detection portion detecting whether an abnormality occurs in at least one of the control circuit and the power supply circuit, the failsafe circuit controlling the first drive element and the second drive element to drive the first load and the second load when the abnormality detection portion has detected that an abnormality occurs in at least one of the control circuit and the power supply circuit and also when the load drive apparatus receives at least one of a command directing a drive of the first load and a command directing a drive of the second load.

According to this configuration, when the abnormality detection portion detects an abnormality in at least one of the control circuit and the power supply circuit and when at least one of a command directing a drive of the first load and another command directing a drive of the second load is received, the fail-safe circuit controls the first drive element and the second drive element to drive the first load and the second load. Thus, it may be possible to drive the load without including another load drive element as a backup even when an abnormality occurs in the control circuit.

BRIEF DESCRIPTION OF THE DRAWINGS

The above and other objects, features and advantages of the present disclosure will become more apparent from the following detailed description made with reference to the accompanying drawings. In the drawings:

FIG. 2 is a circuit diagram illustrating a failsafe portion; and

FIG. 3 is a timing chart illustrating an operation of the load drive apparatus.

DETAILED DESCRIPTION

Figure 1:
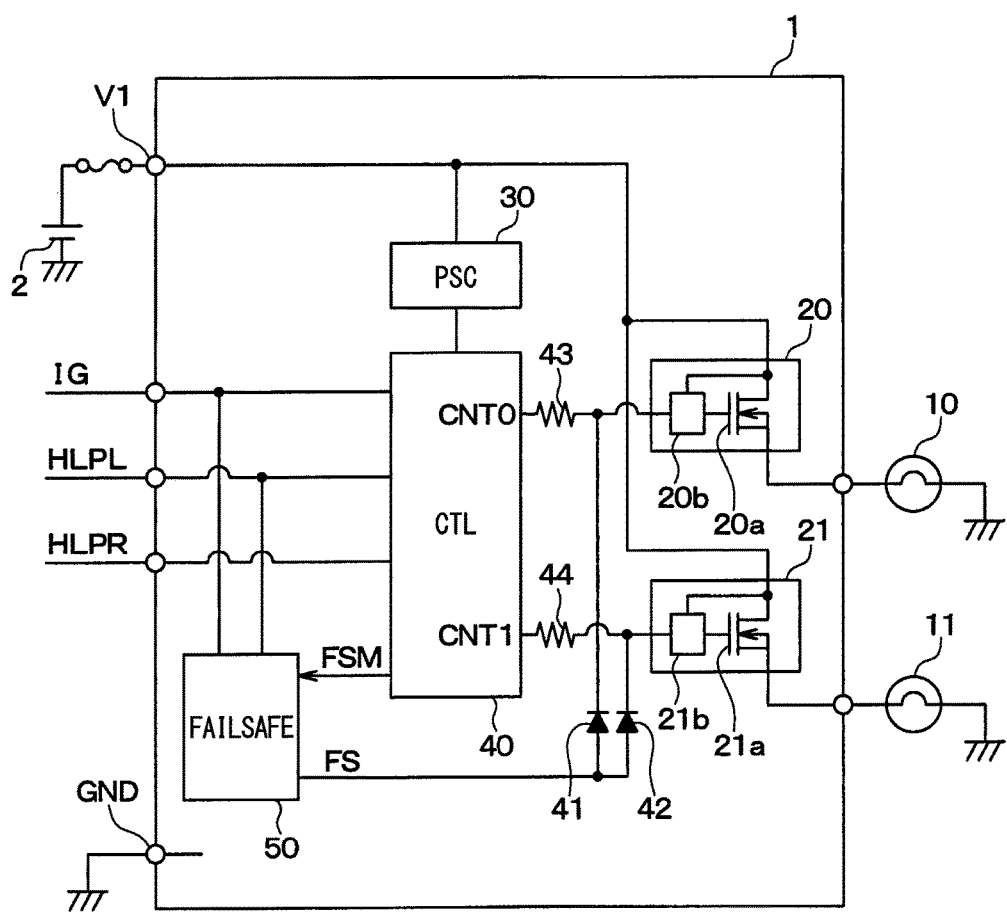
FIG. 1 is a diagram illustrating an overall configuration of a load drive apparatus according to one embodiment of the present disclosure.

FIG. 1 is a diagram illustrating an overall configuration of a load drive apparatus 1 according to one embodiment of the present disclosure. The load drive apparatus 1 of the present embodiment operates by electric power supplied from a battery 2 mounted on a vehicle. The load drive apparatus 1 drives a left headlight and a right headlight mounted in the vehicle. The left headlight corresponds to a first load 10, and the right headlight corresponds to a second load 11. Incidentally, the headlight may also be referred to as a headlamp. The load drive apparatus 1 includes a first drive element 20, a second drive element 21, a power supply circuit 30, a control circuit 40, and a failsafe portion 50.

The first drive element 20 corresponds to a load drive circuit supporting large current driving the first load 10. The second drive element 21 corresponds to a load drive circuit supporting large current driving the second load 11. Each of the first drive element 20 and the second drive element 21 corresponds to an intelligent power device (IPD) including a load short circuit protection function, a self-diagnosis output function, an overheat protection function. The first drive element 20 and the second drive element 21 are arranged independently.

The first drive element 20 has an N-channel type power MOSFET 20a and a MOS driver 20b controlling gate voltage of the power MOSFET 20a. MOSFET means metal-oxide-semiconductor field-effect transistor.

The MOS driver 20b supplies the electric power for operating the power MOSFET 20a corresponding to an ON/OFF control signal inputted from the control circuit 40.

A drain terminal of the MOSFET 20a is connected to the battery 2 through the power supply terminal V1. A source terminal of the MOSFET 20a is grounded through a first load 10.

The gate terminal of the MOSFET 20a receives the ON/OFF control signal from the control circuit 40 through the MOS driver 20b. The MOSFET 20a is turned on and off according to the ON/OFF control signal applied to the gate terminal through the MOS driver 20b. When the MOSFET 20a turns on, a current flows into the first load 10 through the source terminal of the MOSFET 20a from the drain terminal of the MOSFET 20a. Thus, the MOSFET 20a drives the first load 10 according to the ON/OFF control signal inputted from the control circuit 40.

A drain terminal of the MOSFET 21a is also connected to the battery 2 through the power supply terminal V1. A source terminal of the MOSFET 21a is grounded through a second load 11.

The second drive element 21 has the same configuration as the first drive element 20. The second drive element 21 has a power MOSFET 21a and a MOS driver 21b controlling a gate voltage of the power MOSFET 21a. A power MOSFET may be simply referred to as a MOSFET.

The MOS driver 21b supplies the electric power for operating the power MOSFET 21a according to the ON/OFF control signal inputted from the control circuit 40. Thus, the MOSFET 21a drives the second load 11 according to the ON/OFF control signal inputted from the control circuit 40.

The power supply circuit 30 generates a predetermined voltage (for example, 5 V) from the DC (direct-current) voltage outputted from the battery 2. The power supply circuit 30 is provided in order to supply the electric power to the control circuit 40.

The control circuit 40 includes a microcomputer provided with a CPU, a RAM, a ROM, I/O (input and output) or the like. The CPU performs various processing according to a program stored in the ROM (corresponding to a computer readable tangible storage medium). The vehicle inputs an ignition signal IG to the control circuit 40. The ignition signal IG shows a state of an ignition switch. The control circuit 40 has a first output terminal CNT0 and a second output terminal CNT1.

A resistor 43 is provided between the first output terminal CNT0 of the control circuit 40 and the first drive element 20. A resistor 44 is provided between the second output terminal CNT1 of the control circuit 40 and the second drive element 21.

The control circuit 40 receives a left headlight input signal HLPL from an external control apparatus (not shown). The left headlight input signal HLPL is a command that directs actuation of the first load 10. The control circuit 40 receives a right headlight input signal HLPR from an external control apparatus (not shown). The right headlight input signal HLPR is a command that directs actuation of the second load 11.

The control circuit 40 controls the first drive element 20 to drive the first load 10 when receiving the left headlight input signal HLPL of a low level. Specifically, the first output terminal CNT0 outputs the ON/OFF control signal of a high level to the first drive element 20. Incidentally, a high level signal may also be described as a signal of a high level or a signal having a high level, and a low level signal may also be described as a signal of a low level or a signal having a low level.

The control circuit 40 controls the second drive element 21 to drive the second load 11 when receiving the right headlight input signal HLPR of a low level. Specifically, the second output terminal CNT1 outputs the ON/OFF control signal of a high level to the second drive element 21.

The control circuit 40 generates a microcomputer clock signal FSM having a constant frequency inside. The control circuit 40 outputs the microcomputer clock signal FSM to the failsafe portion 50.

The failsafe portion 50 has an abnormality detection portion. The abnormality detection portion detects, based on whether the microcomputer clock signal FSM outputted from the control circuit 40 is abnormal or not, whether an abnormality occurs in at least one of the control circuit 40 and the power supply circuit 30.

In the present embodiment, the failsafe portion 50 receives the left headlight input signal HLPL, but does not receive the right headlight input signal HLPR.

It is supposed that the abnormality detection portion has detected that an abnormality occurs in at least one of the control circuit 40 and the power supply circuit 30 and also that the failsafe portion 50 receives the left headlight input signal HLPL of a low level. In this case, the failsafe portion 50 outputs a failsafe signal FS from a failsafe output terminal T3. The failsafe signal FS controls the first drive element 20 and the second drive element 21 to drive the first load 10 and the second load 11.

The failsafe output terminal T3 of the failsafe portion 50 is connected to the second drive element 21 through a diode 42 while being connected to the first drive element 20 through a diode 41.

The failsafe portion 50 will be explained. FIG. 2 is a circuit diagram illustrating a failsafe portion 50. The failsafe portion 50 is provided with a power supply circuit 60 and a failsafe circuit 70. The failsafe circuit 70 is configured as a single integrated circuit. The failsafe circuit 70 is not configured by a computer performing an arithmetic processing according to a program stored by storage. The failsafe circuit 70 is configured by a transistor, a sequential circuit, a combinational circuit, or the like, in which logical circuits are combined.

The power supply circuit 60 includes a power supply circuit for failsafe that supplies electric power to the failsafe circuit 70. The power supply circuit for failsafe may also be referred to as a failsafe power supply circuit. The power supply circuit 60 generates a predetermined voltage (for example, 5 V) from the ignition signal IG when receiving the ignition signal IG. The voltage generated by the power supply circuit 60 is applied to a power supply terminal (not shown) of the failsafe circuit 70. In other words, the power supply circuit 60 is separately provided by the power supply circuit 30, which supplied electric power to the control circuit, and thus it may be possible to perform a so-called failsafe response in a case of failure of the power supply circuit 30. Only when the ignition turns on (for example, a case of driving), the failsafe circuit 70 is operated by circuit power supply. In a case where the ignition turns off, energy consumption of the circuit is reduced.

The failsafe circuit 70 is provided with an oscillator circuit 71, a timer 72, a comparator 73, inverters 74, 78, a filter 75, a counter 76, an AND circuit 77, and a pnp-type transistor 79, or the like. Incidentally, the timer 72 and the counter 76 configure the abnormality detection portion that detects whether an abnormality occurs in the control circuit 40.

The timer 72 receives from input terminal T1, the microcomputer clock signal FSM generated by the control circuit 40. The timer 52 outputs the microcomputer clock signal FSM to the counter 76 when a duty ratio of the microcomputer clock signal FSM inputted from the control circuit 40 becomes in a predetermined range. The duty ratio is a ratio of a pulse width with respect to the cycle of the microcomputer clock signal FSM. When the duty ratio of the microcomputer clock signal FSM inputted from the control circuit 40 is not within the predetermined range, the timer 52 outputs a low level signal to the counter 76. That is, in this way, when the duty ratio of the microcomputer clock signal FSM is abnormal, the microcomputer clock signal FSM is not outputted to the counter 76 from the timer 72.

An inversed input terminal of the comparator 73 receives the left headlight input signal HLPL from an input terminal T2 of the failsafe portion 50. The comparator 73 outputs a low level signal from an output terminal when the voltage of the left headlight input signal HLPL is equal to or more than a threshold voltage. The comparator 73 outputs a high level signal from the output terminal when the voltage of the left headlight input signal HLPL is less than the threshold voltage.

The counter 76 has a clear terminal CLR. The counted value of the counter 76 is cleared when voltage potential of the clear terminal CLR becomes a high level. That is, when the potential of the left headlight input signal HLPL becomes a high level, the potential of the clear terminal CLR of the counter 76 becomes the high level and the counted value of the counter 76 is cleared.

The counter 76 counts the number of pulses of the microcomputer clock signal FSM outputted from the timer 72 for a fixed period of time. The number of pulses of the microcomputer clock signal FSM may also be referred to as a pulse number of the microcomputer clock signal FSM, for simplicity. When the pulse number of the microcomputer clock signal FSM within the fixed period of time is in a normal range, the counter 76 outputs a low level signal to the AND circuit 77. Incidentally, the counter 76 clears the counted value for each fixed period of time, and starts count operation again.

It is supposed that the pulse number of the microcomputer clock signal FSM per unit time does not included in the normal range. In this case, the counter 76 outputs an abnormality establishment flag AF to the AND circuit 77. The abnormality establishment flag AF is a high level signal.

The filter 75 cuts a noise included in the headlight input signal HLP. The filter 75 removes a high frequency component included in the headlight input signal HLP, and outputs a signal in which the high frequency component has been removed.

The AND circuit 77 has two input terminals and one output terminal, The output terminal of the AND circuit 77 is connected with a transistor 79 through the inverter 78.

A collector of the transistor 79 is connected with the failsafe output terminal T3. The transistor 79 serves as an open collector output. The transistor 79 turns off, and then the collector of the transistor 79 becomes high impedance. The transistor 79 turns on, and then, the potential of the failsafe output terminal T3 becomes a high level.

One of the input terminals of the AND circuit 77 receives the output signal of the counter 76. The other of the input terminals of the AND circuit 77 receives the output signal of the filter 75. The AND circuit 77 outputs a low level signal from the output terminal when the potential of at least one of the input terminals is set to a low level. In this case, the potential of the base terminal of the transistor 79 becomes a high level, and the transistor 79 turns off.

The AND circuit 77 outputs a high level signal from the output terminal when the potential of both input terminals are high level. In this case, a potential of the base terminal of the transistor 79 is made a low level and the transistor 79 turns on.

The abnormality detection portion detects a duty abnormality of the microcomputer clock signal FSM, a high fixing, a low fixing, and a clock period abnormality of the microcomputer clock signal FSM. The high fixing is a condition where a level of the microcomputer clock signal is kept at the high voltage level. The low fixing is a condition where the level of microcomputer clock signal FSM is kept at the low voltage level. When the abnormality detection portion detects the abnormalities of the microcomputer clock signal FSM, the counter 76 outputs the abnormality establishment flag AF of the high level to the AND circuit 77. In this case, the transistor 79 turns on when the output signal of the filter 75 has been the high level.

When the power supply circuit 30 becomes abnormal and the control circuit 40 stops operating, the control circuit 40 no longer outputs the microcomputer clock signal FSM. Therefore, in this case, the counter 76 outputs the abnormality establishment flag AF, which is the high level. In this case, the transistor 79 turns on when the output signal of the filter 75 has been the high level.

An operation of the failsafe circuit 70 will be explained with reference to FIG. 1 to FIG. 3. As illustrated in a part (1) of FIG. 3, when the ignition signal IG is a low level, the power supply circuit 60 does not operate and thus the failsafe circuit 70 does not operate.

It is supposed that the ignition signal IG changes from the low level to the high level in accordance with operation by an occupant. The control circuit 40 and the failsafe circuit 70 start operations. When the control circuit 40 starts operation, the control circuit 40 inputs the microcomputer clock signal FSM to the failsafe circuit 70 (a time t1 in FIG. 3).

As illustrated in a part (2) of FIG. 3, when the control circuit 40 receives the left headlight input signal HLPL of the high level, the potential of the clear terminal CLR of the counter 76 is made the high level and thus the counted value of the counter 76 is cleared. At this time, the counter 76 outputs the low level signal, and the transistor 79 turns off. The collector of the transistor 79 becomes a high impedance state.

When the control circuit 40 receives the left headlight input signal HLPL of the high level, the control circuit 40 controls the first drive element 20 to suspend actuation of the first load 10. Specifically, the control circuit 40 outputs signals of a low level from the first output terminal CNT0 and the second output terminal CNT1, respectively, In other words, the collector of the transistor 79 becomes the high impedance state, and the control circuit 40 outputs the signals of the low level from the first output terminal CNT0 and the second output terminal CNT1, respectively. Therefore, the potential of the gate terminal of the MOSFET 20a of the first drive element 20 and the potential of the gate terminal of MOSFET 21a of the second drive element 21 are made a low level, respectively. Thus, a left leadlight and a right headlight both are switched off.

When the left headlight input signal HLPL changes from the high level to the low level (a time t2 in FIG. 3), the potential of the clear terminal CLR of the counter 76 becomes the low level, so that the counter 76 starts count operation. In this case, when the microcomputer clock signal FSM is normal, the counter 76 outputs the low level signal.

That is, when the duty ratio of the microcomputer clock signal FSM is within a predetermined range and also when the pulse number of the microcomputer clock signal FSM for a fixed period of time $T_{FS}$ is within a normal range, the counter 76 outputs the low level signal. In this case, the filter 75 outputs the high level signal, and the transistor 79 turns off. The collector of the transistor 79 becomes a high impedance state.

Incidentally, when the control circuit 40 receives the left headlight input signal HLPL of the low level, the control circuit 40 controls the first drive element 20 to drive the first load 10. Specifically, the control circuit 40 outputs a high level signal from the first output terminal CNT0 and also outputs the high level signal from the second output terminal CNT1.

That is, since the collector of the transistor 79 becomes the high impedance state and the control circuit 40 outputs the high level signal from the first output terminal CNT0, the potential of the gate terminal of the MOSFET 20a of the first drive element 20 and the gate terminal of the MOSFET 21a of the second drive element 21 each becomes the high level. Thus, a left leadlight and a right headlight both are switched on.

It is supposed that the microcomputer clock signal FSM becomes abnormal (a time t3 in FIG. 3) and the abnormality detection portion has detected that an abnormality occurs in at least one of the control circuit 40 and the power supply circuit 30 (a time t4 in FIG. 3). In this case (at the time t4), when the counter 76 outputs the abnormality establishment flag AF of the high level, the transistor 79 turns on.

Thus, regardless of the potential of the first output terminal CNT0 and the second output terminal CNT1 of the control circuit 40, when the transistor 79 turns on, the potential of the gate terminal of the MOSFET 20a of the first drive element 20 and the gate terminal of the MOSFET 21a of the second drive element 21 becomes respectively high level. Thus, a left leadlight and a right headlight both are switched on.

The first drive element 20 drives the first load 10, and the second drive element 21 drives the second loads 11. The first drive element 20 and the second drive element 21 are independent mutually. According to this configuration, since either one of the first drive element 20 or the second drive element 21 functions when the other of the first drive element 20 or the second drive element 21 does not function, it may be possible to surely prevent both of the left headlight and the right headlight from turning off at night.

According to this configuration, when the abnormality detection portion detects an abnormality in at least one of the control circuit 40 and the power supply circuit 30 and also when the load drive apparatus 1 receives at least one of a command directing a drive of the first load 10 and another command directing a drive of the second load 11, the fail safe circuit 70 controls the first drive element 20 and the second drive element 21 to drive the first load 10 and the second load 11. Thus, it may be possible to drive a load without including a load drive element as a backup even when an abnormality occurs in the control circuit. Furthermore, it is supposed that two headlights in a vehicle correspond to the first load and the second load respectively. One of the first drive element and the second drive element can drive the headlights even when the other of the first drive element and the second drive element gets out of order. Thus, it may be possible to maintain a failsafe mechanism.

The control circuit 40 generates and outputs the clock signal FSM, and the abnormality detection portion determines, based on whether the microcomputer clock signal outputted from the control circuit 40 is normal or not, whether an abnormality occurs in at least one of the control circuit 40 and the power supply circuit 30. Accordingly, with a simple configuration, it may possible to detect whether an abnormality occurs in at least one of the control circuit 40 and the power supply circuit 30.

Furthermore, the abnormality detection portion can detect whether an abnormality occurs in at least of one of the control circuit and the power supply circuit based on whether at least one of a voltage value of the clock signal outputted from the control circuit, the duty ratio of the clock signal, and the number of pulses of the clock signal for a fixed period of time is normal or not.

Furthermore, since the first drive element 20 and the second drive element 21 operates in accordance with the level of the signal outputted from the failsafe output terminal T3 when the failsafe output terminal T3 outputs the failsafe signal, it may be possible to surely drive the loads when an abnormality occurs in the control circuit 40.

Furthermore, when the failsafe output terminal T3 does not output the failsafe signal, a signal outputted from the first output terminal CNT0 of the control circuit 40 controls the first drive element 20 and a signal outputted from the second output terminal CNT1 of the control circuit 40 controls the second drive element 21.

Furthermore, the load drive apparatus includes a failsafe power supply circuit 60 supplying electric power to the failsafe circuit 70. Since the failsafe circuit is operated by the electric power supplied from the failsafe power supply circuit 60, it may be possible to surely drive the first load 10 and the second load 11 in a case where an abnormality occurs in at least one of the control circuit 40 and the power supply circuit 30.

Furthermore, the failsafe power supply circuit 60 supplies electric power to the failsafe circuit 70 from an ignition signal IG inputted from a vehicle. Thus, when the ignition signal IG turns off, the first load 10 and the second load 11 do not receive current. Therefore, it may be possible to prevent a battery death of the battery 2 mounted in the vehicle.

It is supposed that voltage supplied from a vehicle battery to the load drive apparatus reduces temporarily and the control circuit 40 stops controlling the drive of the load due to a reset of the control circuit 40. When the control circuit 40 controls the first load 10 and the second load 11 to drive, it may take a relatively long time before a headlight turns off and again turns on. According to the present disclosure, the load drive apparatus 1 drives the first load 10 and the second load 11 by the failsafe circuit 70 configured from a combination circuit, a transistor, a sequential circuit, or the like. Thus, it may be possible to light up again immediately even when a headlight temporarily turns off.

Since the failsafe circuit 70 controls the first drive element 20 and the second drive element 21 to drive the first load 10 and the second load 11, it may be possible to easily deal with a case where load current of the first load 10 is different from load current of the second load 11.

Further, since the failsafe circuit 70 has small circuit structure, it may be possible to be easily introduced into an integrated circuit such as a communication driver, so that it may be possible to reduce cost.

It is supposed that the first drive element 20 and the second drive element 21 stop actuation of the first load 10 and the second load 11 due to load short circuit protection function. In this case, the failsafe circuit 70 does not control the MOSFET 20a of the first drive element 20 and the MOSFET 21a of the second drive element 21 to forcibly drive the first load 10 and the second load 11. Therefore, it may be possible to secure a safety of the load drive apparatus.

The failsafe circuit 70 monitors the cycle of the microcomputer clock signal FSM using the counter 76. Therefore, it may be possible to guarantee variation accuracy of the cycle of the microcomputer clock signal FSM.

Since the failsafe circuit 70 removes the noise of the microcomputer clock signal FSM using the timer 72, it may be possible to improve a noise resistance.

(Other Embodiment)

(1) In the above embodiment, a headlight of a vehicle is driven as the load. However, a brake light of a vehicle may be driven as the load. Alternatively, a brake light and a headlight of a vehicle may be driven as the load. Alternatively, anything mounted on a vehicle other than the above load may be driven as the load.

(2) In the above embodiment, the control circuit 40 generates and outputs a clock signal (FSM). The abnormality detection portion detects whether or not an abnormality occurs in at least one of the control circuit 40 and the power supply circuit 30 based on whether the clock signal outputted from the control circuit 40 is normal or not.

Alternatively, the control circuit 40 may generate and output a predetermined signal pattern, and the abnormality detection portion may detect whether an abnormality occurs in at least one of the control circuit 40 and the power supply circuit 30 based on whether the signal pattern outputted from the control circuit 40 becomes a predetermined signal pattern or not.

(3) In the above embodiment, the control circuit 40 generates the single microcomputer clock signal FSM and the abnormality detection portion detects whether, based on whether the microcomputer clock signal FSM outputted from the control circuit 40 is normal or not, an abnormality occurs in at least one of the control circuit 40 and the power supply circuit 30.

Alternatively, the control circuit 40 may generate multiple clock signals and the abnormality detection portion may detect whether, based on whether the clock signals outputted from the control circuit 40 is normal or not, an abnormality occurs in at least one of the control circuit 40 and the power supply circuit 30.

(4) In the above embodiment, the failsafe portion 50 receives the left headlight input signal HLPL and does not receive the right headlight input signal HLPR. Alternatively, the right headlight input signal HLPR may be inputted into the failsafe portion 50 and the left headlight input signal LHPL may not be inputted.

(5) In the above embodiment the left headlight input signal HLPL and the right headlight input signal HLPR is separately inputted into the control circuit 40. The control circuit 40 may receive a headlight input signal in common to the left and right headlights.

Therefore, according to the load drive apparatus of the present disclosure, when the abnormality detection portion detects an abnormality in at least one of the control circuit and the power supply circuit and when the load drive apparatus (or a control circuit) receives at least one of a command directing a drive of the first load and another command directing a drive of the second load from, for example, an external control apparatus, the fail-safe circuit controls the first drive element and the second drive element to drive the first load and the second load. Thus, it may be possible to drive the load without including a load drive element as a backup even when an abnormality occurs in the control circuit. Furthermore, for example, supposing that two headlights in a vehicle corresponds to the first load and the second load respectively, one of the first drive element and the second drive element drives even when the other of the first drive element and the second drive element gets out of order. Thus, it may be possible to maintain a failsafe mechanism.

Furthermore, the control circuit may generate and output a clock signal FSM. The abnormality detection portion may detect whether or not an abnormality occurs in at least one of the control circuit and the power supply circuit based on whether the clock signal outputted from the control circuit is normal or not.

According to this configuration, it may be possible that an abnormality occurs in at least one of the control circuit and the power supply circuit with a simple configuration.

Furthermore, the abnormality detection portion may detect whether or not the abnormality occurs in at least one of the control circuit and the power supply circuit based on whether at least one of a duty ratio of the clock signal outputted from the control circuit and the number of pulse of the clock signal for a fixed period is normal or not.

Furthermore, the control circuit may have a first output terminal CNT0 that outputs a signal controlling the first drive element and a second output terminal CNT1 that outputs a signal controlling the second drive element. The failsafe circuit has a failsafe output terminal T3 that outputs a failsafe signal FS controlling the first drive element and the second drive element respectively driving the first load and the second load. The failsafe circuit outputs the failsafe signal FS when the abnormality detection portion detects that an abnormality occurs in at least one of the control circuit and the power supply circuit and when at least one of a command directing drive of the first load and another command directing drive of the second load is inputted. The failsafe output terminal may be connected to the first output terminal and the second output terminal. When the failsafe output terminal outputs the failsafe signal, the first drive element and the second drive element operate in accordance with a level of a signal outputted from the failsafe output terminal.

According to this configuration, since the first drive element and the second drive element operates in accordance with the level of the signal outputted from the failsafe output terminal when the failsafe output terminal outputs the failsafe signal, it may be possible to drive a load surely when an abnormality occurs in the control circuit.

Furthermore, the first drive element may operate in accordance with a level of a signal outputted from the first output terminal and the second drive element may operate in accordance with a level of a signal outputted from the second output terminal when the failsafe output terminal does not output the failsafe signal.

According to this configuration, when the failsafe output terminal does not output the failsafe signal, it may be possible to drive the first drive element by a signal outputted from the first output terminal of the control circuit and also to drive the second drive element by a signal outputted from the second output terminal of the control circuit.

Furthermore, the load drive apparatus may include a failsafe power supply circuit 60 that supplies electric power to the failsafe circuit. The failsafe circuit may be operated by the electric power supplied from the failsafe power supply circuit. Thus, it may be possible to surely drive the first load and the second load in a case where an abnormality occurs in at least one of the control circuit and the power supply circuit.

Furthermore, the failsafe power supply circuit may supply electric power to the failsafe circuit from an ignition signal IG inputted from a vehicle. Thus, when the ignition signal IG is turned off, current does not flow through the first load 10 and the second load 11. It may be possible to prevent a battery mounted on the vehicle from being exhausted.

While the embodiments, the configurations, the aspects of the load drive apparatus have been described by way of example, it should be appreciated that embodiments, configurations, aspects of the present disclosure are not limited to the respective embodiments, the respective configurations, and the respective aspects described above. For example, embodiments, configurations, aspects obtained by appropriately combining technical portions disclosed in different embodiments, configurations, and aspects are included within a range of embodiments, configurations, and aspects of the present disclosure.

What is claimed is:

1. A load drive apparatus comprising:
a first drive element that drives a first load;
a second drive element that drives a second load, the second drive element and the first drive element being independently placed;
a control circuit that controls the first drive element and the second drive element in accordance with input of a command directing drive of at least one of the first load and the second load;
a power supply circuit that supplies electric power to the control circuit; and
a failsafe circuit that includes an abnormality detection portion detecting whether an abnormality occurs in at least one of the control circuit and the power supply circuit, the failsafe circuit controlling the first drive element and the second drive element to drive both of the first load and the second load when the abnormality detection portion has detected that an abnormality occurs in at least one of the control circuit and the power supply circuit and also when the load drive apparatus receives at least one of a command directing a drive of the first load and a command directing a drive of the second load,
wherein:
the failsafe circuit receives electric power from a different power source, the different power source being different from the power supply circuit; and
the failsafe circuit generates a predetermined voltage from the electric power received from the different power source.

2. The load drive apparatus according to claim 1, wherein:
the control circuit generates and outputs a clock signal; and
the abnormality detection portion detects whether an abnormality occurs in at least one of the control circuit and the power supply circuit, based on whether the clock signal outputted from the control circuit is normal or not.

3. The load drive apparatus according to claim 2, wherein:
the abnormality detection portion detects whether an abnormality occurs in at least of one of the control circuit and the power supply circuit based on whether at least one of a voltage value of the clock signal outputted from the control circuit, a duty ratio of the clock signal, and a total number of pulses of the clock signal for a fixed period of time is normal or not.

4. The load drive apparatus according to claim 1, wherein:
the control circuit has a first output terminal outputting a signal controlling the first drive element and a second output terminal outputting a signal controlling the second drive element;
the failsafe circuit has a failsafe output terminal outputting a failsafe signal when the abnormality detection portion has detected that an abnormality occurs in at least one of the control circuit and the power supply circuit and also when the load drive apparatus receives at least one of the command directing the drive of the first load and the command directing the drive of the second load, wherein the failsafe signal controls the first drive element and the second drive element to drive the first load and the second load;
the failsafe output terminal is connected with the first output terminal and the second output terminal; and
the first drive element and the second drive element operate in accordance with a level of the failsafe signal outputted from the failsafe output terminal when the failsafe output terminal outputs the failsafe signal.

5. The load drive apparatus according to claim 4, wherein:
when the failsafe output terminal outputs no failsafe signal,
the first drive element operates in accordance with a signal outputted from the first output terminal, and
the second drive element operates in accordance with a signal outputted from the second output terminal.

6. The load drive apparatus according to claim 1, further comprising:
a failsafe power supply circuit that receives the electric power from the different power source and supplies electric power to the failsafe circuit,
wherein:
the failsafe circuit operates with the electric power supplied by the failsafe power supply circuit.

7. The load drive apparatus according to claim 6, wherein:
the electric power received from the different power source by the failsafe power supply circuit is received from an ignition signal of a vehicle that includes the load drive apparatus.

8. The load drive apparatus according to claim 1, wherein:
the control circuit has a first output terminal outputting a signal controlling the first drive element and a second output terminal outputting a signal controlling the second drive element;
the failsafe circuit has a failsafe output terminal that is connected with both of the first output terminal and the second output terminal, and that outputs a failsafe signal; and
both of the first drive element and the second drive element operate in accordance with a level of the failsafe signal outputted from the failsafe output terminal when the failsafe output terminal outputs the failsafe signal; and
the first drive element and the second drive element drive the first load and the second load drive, respectively, in accordance with the level of the failsafe signal.

9. The load drive apparatus according to claim 8, wherein:
the failsafe output terminal outputs the failsafe signal when the abnormality detection portion has detected that an abnormality has occurred in at least one of the control circuit and the power supply circuit and also when the load drive apparatus receives at least one of the command directing the drive of the first load and the command directing the drive of the second load.

10. The load drive apparatus according to claim 1, wherein:
the different power source is an ignition signal.

* * * * *